United States Patent [19]
Chan

[11] Patent Number: 6,025,742
[45] Date of Patent: Feb. 15, 2000

[54] LOW VOLTAGE DIFFERENTIAL SWING DRIVER CIRCUIT

[75] Inventor: Francis H. Chan, Williston, Vt.

[73] Assignee: International Business Machines Corporation, Armonk, N.Y.

[21] Appl. No.: 09/001,989

[22] Filed: Dec. 31, 1997

[51] Int. Cl.[7] ................................ H03F 3/45; H03F 3/18
[52] U.S. Cl. ........................ 327/108; 327/563; 330/146; 330/253; 326/30; 326/86
[58] Field of Search ............................ 327/65, 563, 108, 327/541, 543; 330/252, 253, 255, 261, 296, 146; 326/30, 86, 57, 58; 363/17, 98, 132

[56] References Cited

U.S. PATENT DOCUMENTS

| | | | |
|---|---|---|---|
| 3,495,223 | 2/1970 | Martin, Jr. | 330/146 |
| 3,530,391 | 9/1970 | Goordman | 330/146 |
| 4,117,415 | 9/1978 | Hoover | 330/146 |
| 4,710,686 | 12/1987 | Guzik | 363/98 |
| 5,202,645 | 4/1993 | Phan et al. | 330/253 |
| 5,463,348 | 10/1995 | Sarpeshkar et al. | 330/253 |
| 5,528,197 | 6/1996 | Frey | 330/254 |
| 5,585,741 | 12/1996 | Jordan | 326/30 |

OTHER PUBLICATIONS

Millman, Jacob, "Microelectronics: Digital and Analog Circuits and Systems," McGraw–Hill, Inc., 1979, Sec. 18–9, p. 677.

*Primary Examiner*—Timothy P. Callahan
*Assistant Examiner*—Terry L. Englund
*Attorney, Agent, or Firm*—Pollock, Vande Sande & Amernick

[57] ABSTRACT

A low voltage differential swing driver circuit comprises first and second serially connected field effect transistors connected in series through first and second resistors. Third and fourth field effect transistors are serially connected together through third and fourth resistors. A diode connects one side of each of the serially connected transistors to one side of a source of regulated low voltage. A remaining side of the regulated low voltage source is connected to a remaining side of the serially connected transistors whereby differential currents are produced through the pairs of transistors. A voltage bias source is connected to a junction of said first and second resistors and to the junction of said third and fourth resistors. Control logic supplies a data switching signal to a gate of the first and fourth transistors, and a complementary data switching signal to a gate of said second and third transistors. A differential signal is produced between said junctions which are connected to first and second transmission lines.

7 Claims, 4 Drawing Sheets

LOW VOLTAGE DIFFERENTIAL SWING DRIVER CIRCUIT

BACKGROUND OF THE INVENTION

The present invention relates to CMOS driver circuits which provide data for transmission to a remote location. Specifically, a differential signal driver comprising CMOS circuit elements which can provide an analog differential voltage for transmitting 800 megabits of data per second is described.

Data transfers between computing devices are occurring at increasing speeds. This is particularly true for I/O communications between work stations and a server, as well as between personal computers and peripheral devices. The data transmissions from an I/O port of one device to an I/O port of another device are through a coaxial cable which has a characteristic impedance of 50 ohms. These transmission lines are usually driven differentially, i.e., first and second complementary analog signals, representing a data bit, are applied to a conductor of each transmission line. In order to generate analog data signals in the 600 MHZ/1.2 gigabits per second range, circuit components which can operate at these frequencies are needed. In the past, emitter coupled logic was the usual choice since it is capable of the high frequency switching necessary to transmit these higher data rates. The emitter coupled logic, however, dissipates considerably more power than conventional CMOS logic, and is also relatively more expensive to implement than CMOS circuit elements.

The driver circuit for sending data over these transmission lines ideally produces a differential voltage swing which is between 250 and 400 Mv under all operating conditions as set forth in the appropriate IEEE standard. Maintaining this voltage swing over various environmental conditions, including changes of temperature and changes in power supply voltage levels, provides for efficient power consumption while producing reliable switching signals which can be sensed by a receiver terminating the transmission lines.

BRIEF SUMMARY OF THE INVENTION

It is an object of this invention to provide a high speed CMOS circuit which can provide an analog signal for driving a transmission line.

It is a specific object of this invention to provide a CMOS low voltage differential swing driver which provides stable analog driving signals over time.

These and other objects of the invention are provided for by a CMOS driver circuit. The CMOS driver circuit provides a differential output signal in response to a data signal having a data rate of up to 800 megabits per second.

In carrying out the invention, a first pair of CMOS field effect transistors (FET) are connected in series between terminals of a regulated voltage supply. A second pair of CMOS transistors are also serially connected with each other, and connected in parallel with the first pair of CMOS transistors across the regulated voltage supply.

The series connection of each pair of transistors forms a differential output terminal for driving a transmission line. A separate bias voltage supply is connected through a pair of resistor elements to each of the junctions, forming a common bias voltage for each differential signal output terminal.

A transistor of each pair is switched by a logic signal, and the remaining transistors of each pair are switched by a complement of the logic signal to provide first and second differential currents from each output terminal to individual conductors of a transmission line. By connecting each of the junctions and their respective output terminals together through each resistor and the bias voltage supply, the output impedance presented by the driver circuit to the transmission line is reduced.

Maintaining the voltage supply to the driver circuit tightly regulated holds the output differential voltages to a regulated 250 to 400 Mv level under various temperature and voltage supply variations. The small differential voltage swing produced by the device maintains power consumption at a minimum while providing for reliable signal levels to be received by the receiver terminating the transmission line.

DETAILED DESCRIPTION OF THE INVENTION

Figure 1:
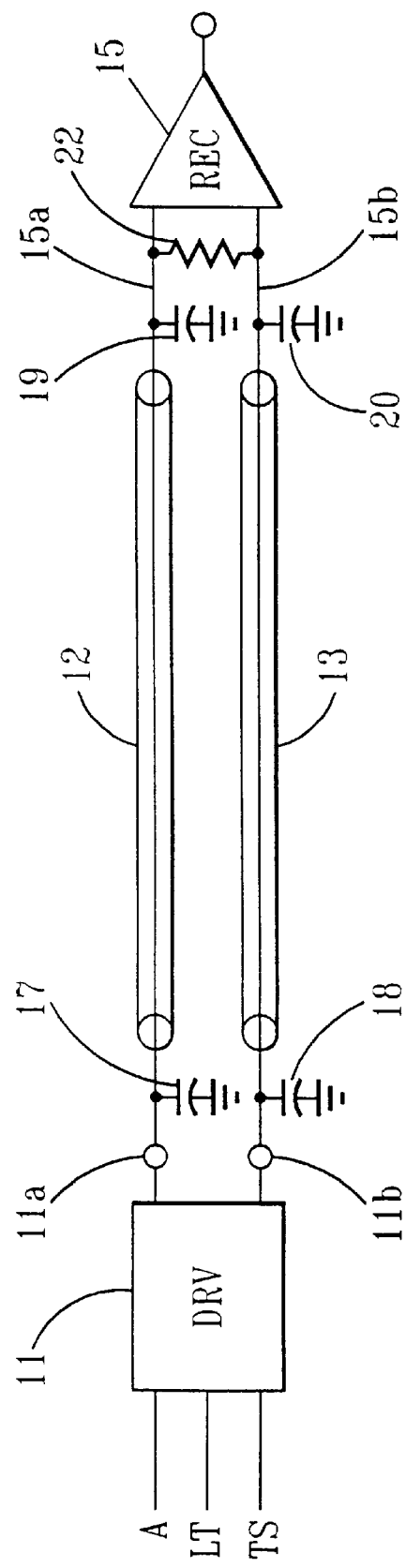
FIG. 1 illustrates a digital driver circuit for converting digital data to a differential analog signal for transmission to a remote receiver 15.

Referring now to FIG. 1, an analog differential driver circuit 11 having differential outputs 11a and 11b connected to first and second transmission lines 12 and 13 is shown. The transmission lines are generally coaxial, and have inputs and outputs which have a respective capacitance 17–20. The transmission lines 12 and 13 are terminated with a receiver 15 having a differential characteristic impedance 22 of 100 Ohms to match the transmission lines 12 and 13 characteristic impedances. A digital data signal A is supplied to the differential analog driver circuit 11 and first and second analog signals are produced at output terminals 11a and 11b. Control signals LT and TS are applied to the driver circuit in a known way for disabling the driver circuit under various I/O port conditions. The LT signal disables all devices having standby currents during the Iddq leakage test which is common to CMOS circuits. The TS signal disables the driver circuit when I/O port control logic is to be in a listen only condition.

The analog signals provided to the input of receiver 15 are complementary time varying signals representing an analog data signal and its complement. A voltage swing of between 250 to 400 Mv peak to peak, as set forth in the appropriate IEEE standard, is differentially detected at the receiver input to indicate a change in state from the 0 to 1, and 1 to 0, respectively.

The transmission lines 12 and 13 have a natural impedance of 50 Ohms, and may have a length of 100 centimeters. When switching at high data rates, i.e., data rates approaching 1.2 gigabits per second, the transmission lines are subject to reflections and impedance matching between each end thereof becomes necessary. Further, power dissipation should be kept to a minimum, restricting the drive voltage for the sending end of the transmission lines 12 and 13 to the nominal 250–400 Mv peak to peak differential value. The present invention derives from the digital input signal A two differential analog signals which under worst case circuit operating conditions maintain an amplitude level of between 250 and 400 Mv peak to peak level, at an impedance which substantially matches with the impedance presented by transmission lines 12 and 13.

Figure 2:
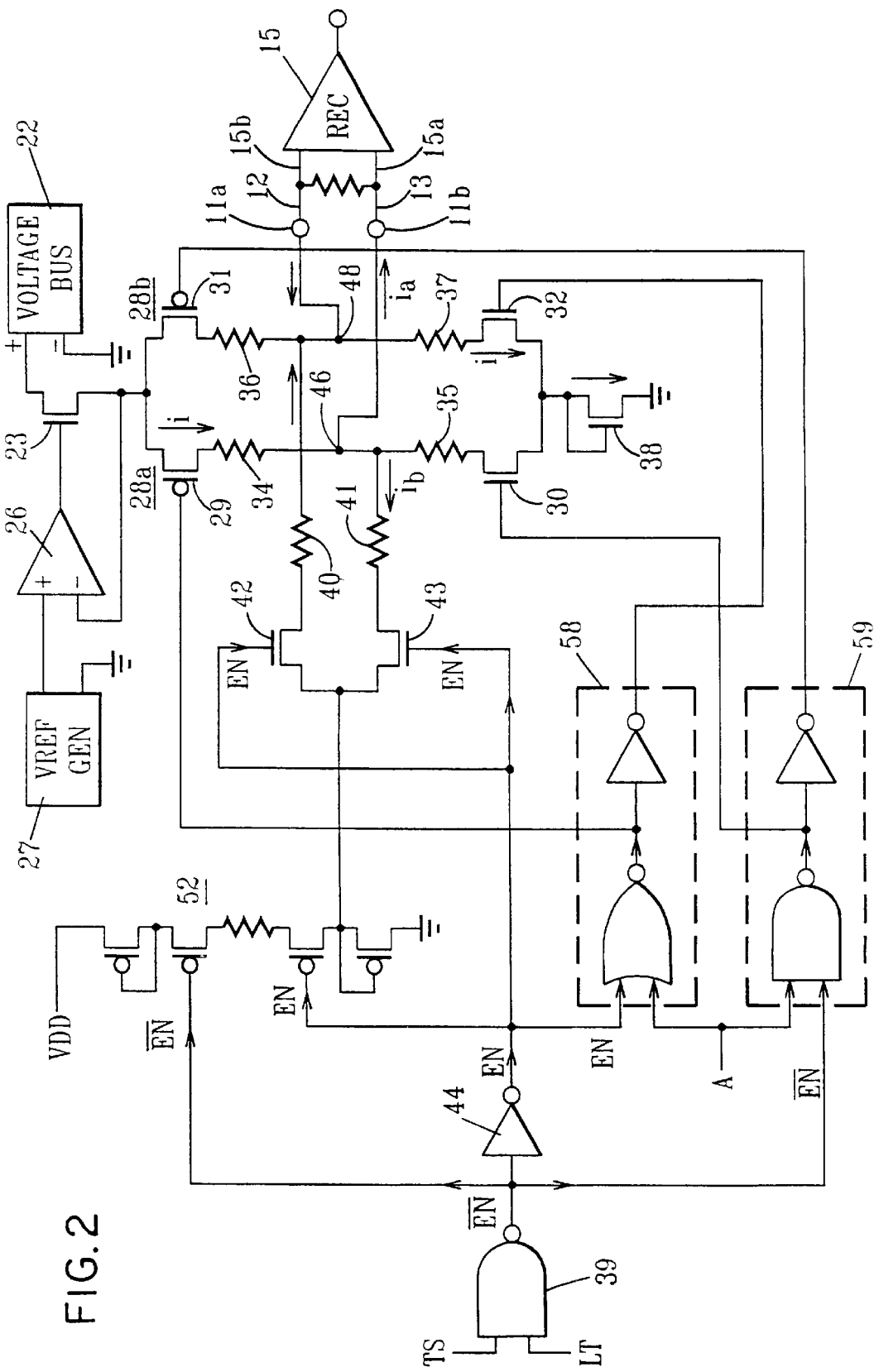
FIG. 2 is a detailed schematic drawing of the driver circuit 11 of FIG. 1.

Referring now to FIG. 2, a detailed schematic drawing of the differential analog driver circuit 11 is shown. The differential driver circuit 11 provides a regulated operating voltage which may be derived from a source of DC voltage presented by a voltage bus 22. The unregulated 2.5 volt voltage bus 22 is regulated by a series pass transistor 23, having a substantially zero gate to source voltage threshold. Transistor 23, and the remaining transistors of the circuit, are field effect transistors fabricated in CMOS. Field effect transistor 23 has a control gate connected to the output of a comparator circuit 26 which has a first input connected to a reference voltage of 1.8 volts, and a second input connected to the remaining terminal of the series pass transistor 23.

The voltage to the device is regulated at a very high level regulation approaching ±0.1%. The regulation is achieved by continually comparing the voltage from the series pass transistor 23 with the output of a reference voltage generator 27. The reference voltage generator 27 may be a band gap generator, as is known in CMOS circuit design, having a constant output of 1.8 v.

The regulated voltage is used to drive each of the differential output terminals 11a and 11b under control of a data signal A. The circuit for driving each of the output terminals 11a and 11b comprises first and second parallel branches 28a and 28b connected across the regulated power supply voltage through a diode 38. The first branch 28a comprises a PMOS transistor 29 serially connected with an NMOS transistor 30 through resistors 34 and 35. The junction 46 of the resistors 34 and 35 is connected to an output terminal 11b. Branch 28b similarly includes a PMOS transistor 31 serially connected to an NMOS transistor 32 through resistors 36 and 37. Resistors 34–37 have controlled tolerances to minimize output impedance fluctuations. The junction 48 of resistors 36 and 37 is connected to the second differential output terminal 11a.

When the enable signal EN from inverter 44 and Nand gate 39 is high in response to TS and LT from the I/O output port control electronics, the CMOS data signal A produces a switching signal from logic circuit 58 on the gates of transistors 29 and 32. A complementary switching signal is provided on the gates of transistors 30 and 31 by logic circuit 59.

Junctions 46 and 48 are also connected to a source bias voltage provided by a bias transistor string 52. Bias string 52 establishes a clamped bias voltage of substantially 1.25 volts from the unregulated DC bus voltage VDD. The bias voltage is applied to resistors 40 and 41 under control of gates 42 and 43 to each of the junctions 46 and 48.

The switching sequence for generating the analog signal which drives each of the output terminals 11a and 11b is as follows.

When the logic state logic signal A is at 1, PMOS transistor 29 and NMOS transistor 32 are rendered conducting. Current i flows through PMOS transistor 29, resistor 34, and then splits at junction 46 into a first component ia which is directed to the output terminal 11b, and into a second component ib directed toward the bias voltage supply 52, and then through resistor 41, transistors 42, 43 and resistor 40 where it combines at 48 with current flowing from output terminal 11a, from the load.

When a logic 0 state is applied as a logic signal A, PMOS transistor 31 and NMOS transistor 30 are rendered conducting by the signal from logic circuit 59. Current is driven through junction 48, out to a load and back to junction 46. An additional component of current from junction 48 is diverted through resistors 41 and 40 back to junction 46.

The current through the load connected at the end of transmission lines 12 and 13 is a differential current produced by the voltages on transmission lines 12 and 13 which are out of phase. The diversion of current through resistors 40 and 41 reduces the input impedance to the transmission lines 12 and 13, thus presenting an impedance to the input of transmission lines 12 and 13 that substantially matches the characteristic impedance of the transmission lines 12, and 13.

A diode 38 connects the branches 28a and 28b to the common terminal of the regulated voltage supply. The regulation of the voltage supply to the circuit branches 28a and 28b maintains the voltage swing, peak to peak, between output terminals 11a and 11b to the 250–400 Mv IEEE standard. The effects of temperature of variations of the unregulated DC voltage bus 22 on the circuit are illustrated in FIGS. 3 and 4.

Figure 3:
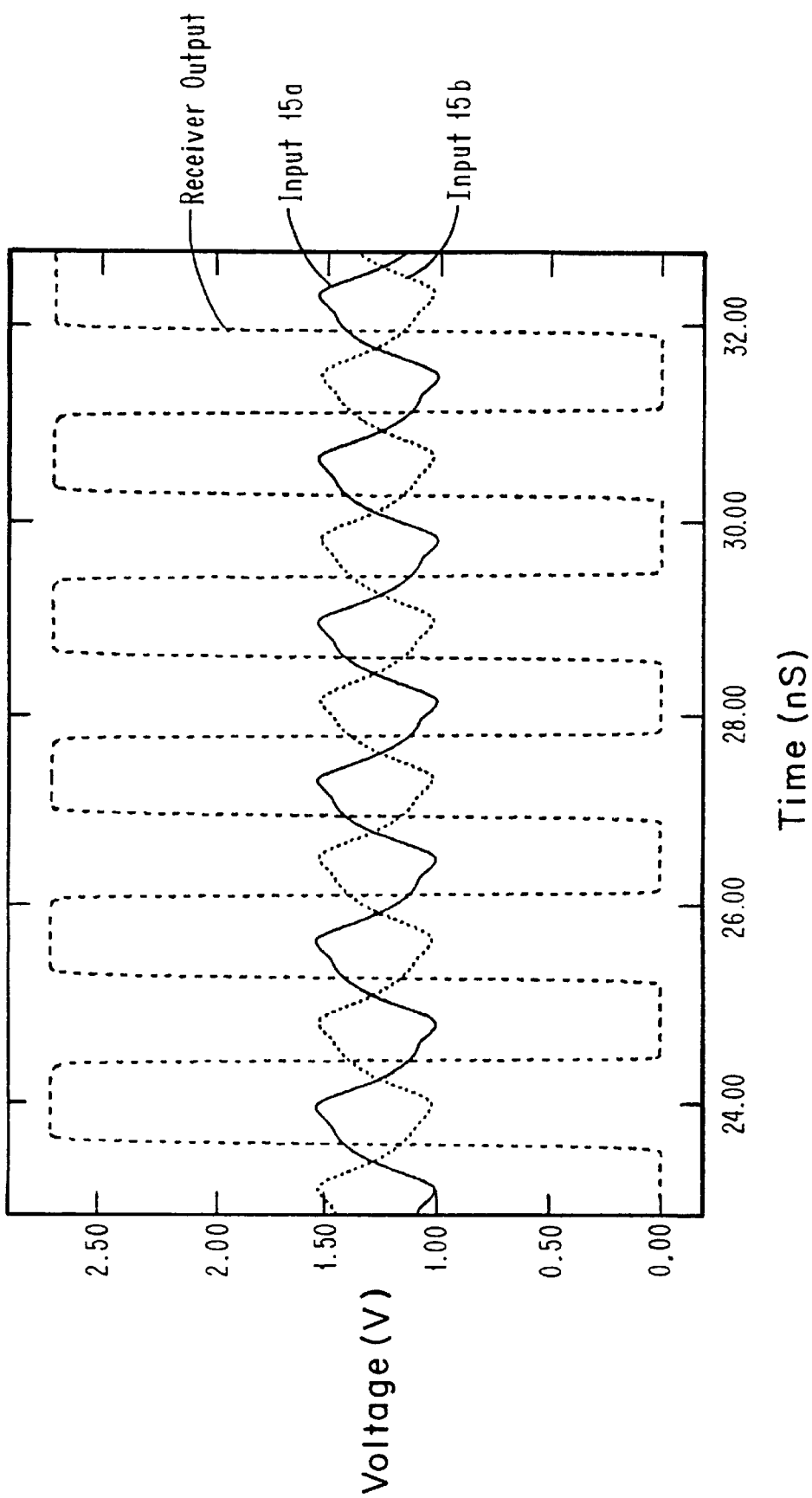
FIG. 3 shows the output signals of the differential driver 11 and the response of the receiver 15 to the analog differential data signal received from transmission lines 12 and 13 under nominal operating conditions.
Figure 4:
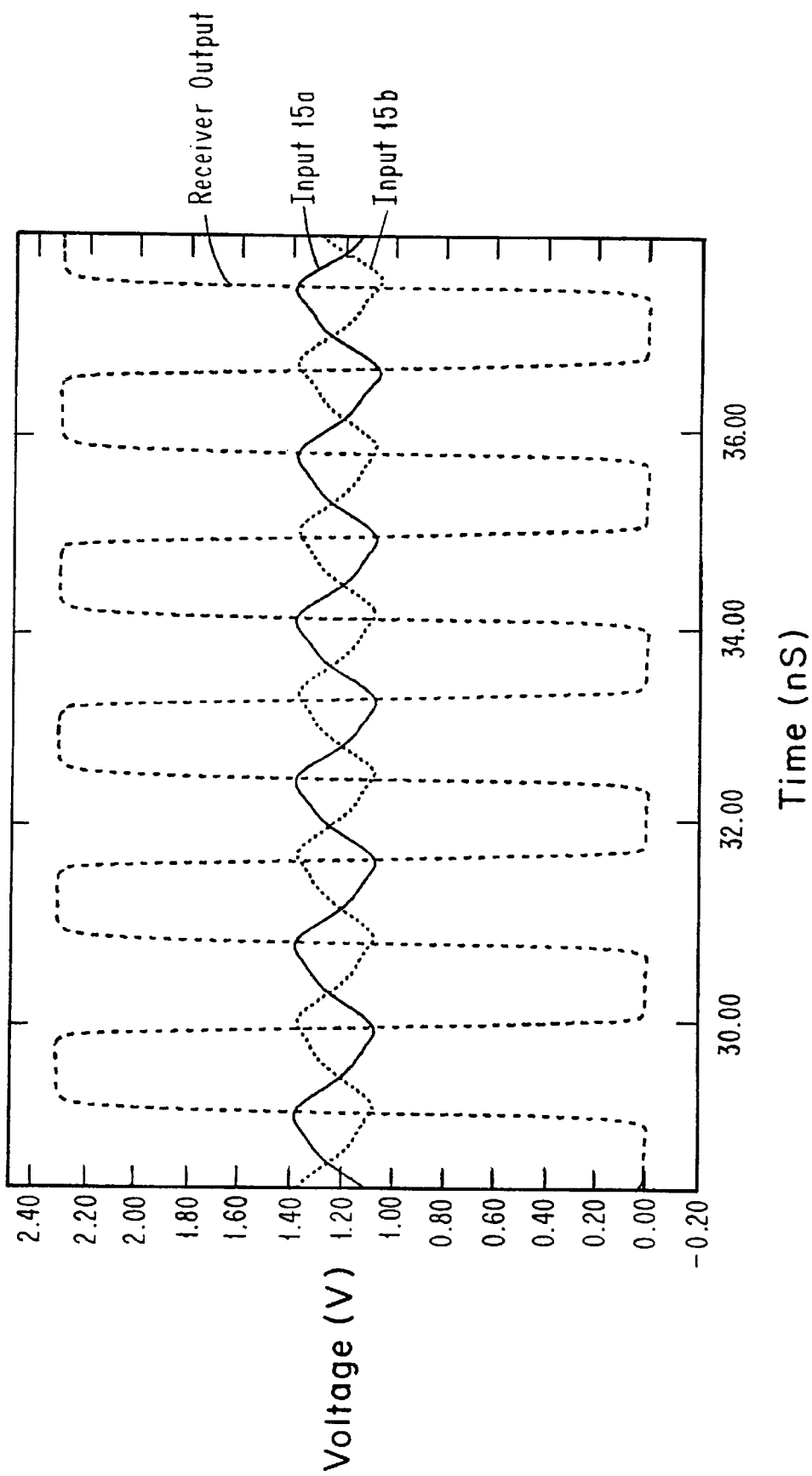
FIG. 4 illustrates the response of the receiver 15 to the analog data under worst case temperature and supply voltage variation conditions.

FIG. 3 shows the performance of the circuit using best case manufacturing tolerances at zero degrees °C. and a DC bus voltage of 2.7 volts. The differential signals received at terminals 15a and 15b over transmission lines which are 100 cm in length are shown superimposed on the output data produced by receiver 15 of FIG. 2. The differential voltage swing presented by each of the voltages on terminals 15a and 15b has a bias voltage component of approximately 1.25 volts which is reliably detected by the receiver. FIG. 4 illustrates the circuit performance for worst case manufacturing process, with operating conditions at their worst case where the temperature is approximately 100° C. and the unregulated voltage source has dropped to 2.3 volts. Under these worst case situations, the receiver 12 is able to switch at substantially the peak differential voltage between inputs 15a and 15b.

The circuit provides for high speed data transfer at up to 1.2 gigabits per second by controlling each of the transistors 29–32 branches 28a and 28b at a frequency of 600 mHZ. The power consumption for the driver circuit is maintained at a minimum by insuring that the appropriate differential voltage levels within the IEEE standard are maintained for all likely operating conditions by the voltage regulation circuit.

The regulated voltage may be set at 1.8 volts, under control of voltage reference generator 27 with the DC bus voltage between 2.3 and 2.7 volts, using the aforesaid 0 volt gate to source threshold NMOS transistor 23. As the unregulated DC bus voltage 22 is increased, it is, of course, possible to use other series-type NMOS transistors having a non-zero gate to source voltage threshold for establishing the regulated DC voltage.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A low voltage differential swing driver circuit comprising:
   a first current branch comprising first and second serially connected field effect transistors serially connected together through first and second resistors;
   a second current branch comprising third and fourth field effect transistors serially connected together through third and fourth resistors;
   a diode connecting one side of each of said current branches to one side of a source of regulated low voltage, a remaining side of said regulated low voltage source being connected to a remaining side of said current branches whereby differential currents are produced through said current branches;
   a voltage bias source connected to a first junction of said first and second resistors and to a second junction of said third and fourth resistors; and
   control logic for supplying a data switching signal and an inverse of said data switching signal to a gate of said first and fourth transistors, respectively, and a complementary data switching signal and an inverse of said complementary data switching signal to a gate of said second and third transistors, respectively;
   whereby a differential signal is produced between said junctions which are connected to first and second transmission line loads.

2. The circuit of claim 1 wherein said regulated voltage source comprises:
   a series pass transistor connected at one end to one side of a d.c. voltage bus;
   a voltage reference generator; and
   a comparator circuit having one input connected to said voltage reference generator and a second input connected to a second side of said series pass transistor which forms said remaining side of said regulated voltage source; said comparator providing a control signal to a gate of said series pass transistor which establishes a regulated voltage on said remaining side of said regulated voltage source, with respect to a common side of said d.c voltage bus which serves as said one side of said regulated voltage source.

3. The circuit of claim 1 wherein said voltage bias source provides a bias voltage through fifth and sixth resistors to junctions, respectively, wherein said fifth and sixth resistors diverting a portion of the current through said first and fourth transistors away from said transmission line loads connected to said junctions while lowering an impedance presented by said junctions to the connected transmission line loads.

4. A low voltage differential swing driver circuit comprising:
   a source of regulated d.c. voltage;
   first and second pairs of transistors, the first pair of transistors connected in series by a first resistor means which forms a first junction comprising one output terminal of a differential voltage source, the second pair of transistors being connected in series by a second resistor means forming a second junction comprising a second output terminal of said differential voltage source, said first and second pairs of transistors being connected across said source of regulated d.c. voltage;
   a source of bias voltage connected through first and second resistors to said first and second junctions, establishing a nominal voltage on said output terminals; and
   data signal means for applying a switching signal and an inverse of said switching signal to respective gates of one transistor in each pair of said transistors, and a complementary switching signal and an inverse of said complementary switching signal to the gates of a respective remaining transistor of each pair of said transistors, whereby an alternating current is produced through a load connected to said first and second output terminals.

5. The circuit according to claim 4 wherein a diode is connected in series with one side of said source of regulated d.c. voltage and said first and second pairs of transistors.

6. The circuit according to claim 4 wherein said source of regulated d.c. voltage comprises:
   a series pass field effect transistor having a drain connected to one terminal of a source of unregulated voltage; and
   a comparator having one input connected to a reference voltage and a second input connected to a source of said field effect transistor, and an output terminal connected to a control gate of said field effect transistor which maintains a constant voltage between said transistor source and a remaining terminal of said source of unregulated voltage.

7. The circuit according to claim 6 wherein said series pass field effect transistor has a zero volt gate to source conduction threshold.

* * * * *